United States Patent [19]

Pfeifer et al.

[11] Patent Number: 5,541,135
[45] Date of Patent: Jul. 30, 1996

[54] METHOD OF FABRICATING A FLIP CHIP SEMICONDUCTOR DEVICE HAVING AN INDUCTOR

[75] Inventors: Michael J. Pfeifer, Chandler; George W. Marlin, Phoenix, both of Ariz.

[73] Assignee: Motorola, Inc., Schaumburg, Ill.

[21] Appl. No.: 452,784

[22] Filed: May 30, 1995

[51] Int. Cl.[6] .................................................. H01L 21/70
[52] U.S. Cl. .............................. 437/60; 437/54; 437/189; 437/209
[58] Field of Search .............................. 437/60, 54, 182, 437/183, 189, 192, 194, 203, 209; 251/528, 531, 532, 724, 778, 924

[56] References Cited

U.S. PATENT DOCUMENTS

| | | | |
|---|---|---|---|
| 3,691,628 | 9/1972 | Kim et al. ................................. | 437/209 |
| 4,034,399 | 7/1977 | Drukier et al. ........................... | 257/778 |
| 5,087,896 | 2/1992 | Wen et al. ................................ | 331/99 |
| 5,177,670 | 1/1993 | Shinohara et al. ....................... | 257/924 |
| 5,189,507 | 2/1993 | Carlomagno et al. ................... | 257/724 |
| 5,200,364 | 4/1993 | Loh .......................................... | 437/209 |
| 5,276,351 | 1/1994 | Yamazaki et al. ....................... | 257/778 |
| 5,397,729 | 3/1995 | Kayanuma et al. ..................... | 437/60 |
| 5,410,179 | 4/1995 | Kornrumpf et al. ..................... | 257/638 |
| 5,420,063 | 5/1995 | Maghsoudnia et al. ................. | 437/60 |
| 5,488,007 | 1/1996 | Kim et al. ................................ | 437/60 |

OTHER PUBLICATIONS

Chong H. Ahn, et al., IEEE Transactions on Components, Packaging, and Manufacturing Technology–Part A, vol. 17. No. 3, "A Fully Integrated Planar Toroidal Inductor with a Micromachined Nickel–Iron Magnetic Bar", p. 466 Sep. 1994.

*Primary Examiner*—Kevin M. Picardat
*Attorney, Agent, or Firm*—George C. Chen

[57] ABSTRACT

Flip chip bumps (24, 26, and 27) and an inductor (17) are simultaneously fabricated on a semiconductor substrate (10). The fabrication process includes two electroplating steps. The first step electroplates copper (18) onto a seed layer (13) to form the inductor (17) and a first portion (16) of the flip chip bumps (24, 26, and 27). The second step electroplates copper (21) onto the previously electroplated copper (18) to form a second portion (21) of the flip chip bumps (24, 26, and 27).

17 Claims, 1 Drawing Sheet

METHOD OF FABRICATING A FLIP CHIP SEMICONDUCTOR DEVICE HAVING AN INDUCTOR

BACKGROUND OF THE INVENTION

This invention relates, in general, to a method of making an electronic device, and more particularly, to a method of fabricating a flip chip semiconductor device having an integrated inductor.

With the expanding portable communications market, many products operate in the rf or radio frequency ranges. Integrated circuits operating in these high frequency ranges require passive components including inductors and capacitors for impedance matching, capacitive coupling, filtering, and tuning. In addition to the passive components, flip chip bumps are used for improving high frequency performance over conventional wire bonded semiconductor chips.

An integration scheme for flip chip bumps and inductors involves sputtering a seed layer comprising titanium tungsten and copper onto a substrate, using a first photoresist pattern to define inductors on the seed layer, and electroplating copper onto the exposed portions of the seed layer to form the inductors. After removal of the first photoresist pattern, a second photoresist pattern is used to cover the inductors and to define flip chip bumps on the seed layer. Copper is subsequently electroplated onto the exposed portions of the seed layer to form the copper stud portion of the flip chip bumps. Lead is electroplated onto the copper of the flip chip bump; tin is electroplated onto the lead; and finally, the second photoresist pattern is removed.

To eliminate shorting of the inductors and the flip chip bumps by the seed layer, the portion of the seed layer not used to define the inductors or flip chip bumps must now be removed. It is this removal process which introduces manufacturing issues into the integration scheme.

When a commercially available etchant such as MacDermit Metex FA/Metex FB is used to etch the exposed sputtered copper of the seed layer, the electroplated copper inductors are etched even more aggressively due to the approximate 5:1 etch selectivity of Metex FA/Metex FB for electroplated and sputtered copper. The aggressive etching of the electroplated copper inductor changes its inductance and detrimentally affects the high frequency performance of the integrated device. To improve the etch selectivity, ammonium peroxydisulfate is used to reduce the etch rate of the electroplated copper while increasing the etch rate of the sputtered copper. However, ammonium peroxydisulfate also aggressively etches tin which degrades the flip chip bump. The lead tin cap covering the copper stud of the flip chip bump is required for bonding of the semiconductor device to a substrate.

The sputtered copper seed layer can be etched prior to the lead and tin plating to eliminate the problem of ammonium peroxydisulfate etching the tin cap of the flip chip bump. However, the second photoresist pattern must first be removed prior to etching the sputtered copper seed layer. Additionally, after the etch, a third photoresist pattern must be developed to the precise alignment of the second layer. The extremely small alignment tolerance of the third layer of photoresist is crucial for proper fabrication of flip chip bumps. Consequently, the alignment process is quite difficult and increases the fabrication process cycle time due to the additional photoresist step.

Accordingly, a need exists for fabricating a flip chip semiconductor device having integrated inductors. The fabrication method should not significantly degrade the inductors or the flip chip bumps and should not significantly increase process cycle time.

BRIEF DESCRIPTION OF THE DRAWINGS

In accordance with the present invention.

DETAILED DESCRIPTION OF THE DRAWINGS

Figure 1:
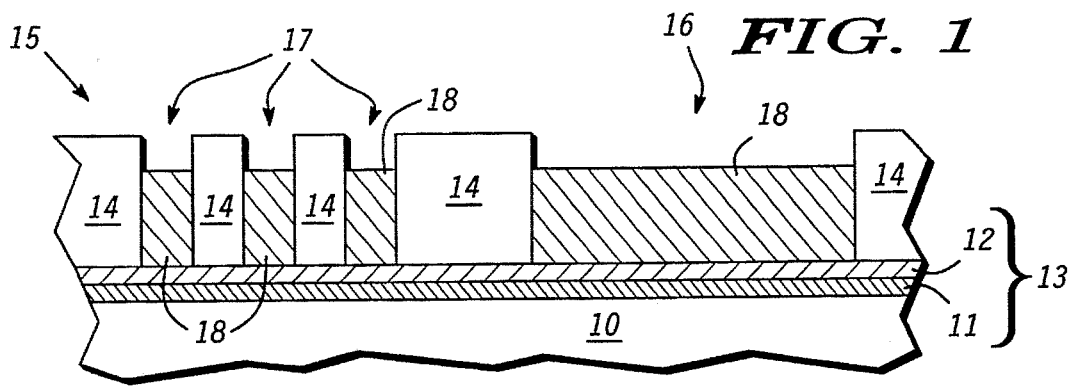
FIGS. 1–4 illustrate cross-sectional views of sequential fabrication steps for a flip chip semiconductor device having an integrated inductor.

Turning first to FIG. 1, semiconductor substrate 10 is a silicon, gallium arsenide, indium phosphide, or other substrate. In the preferred embodiment, semiconductor substrate 10 comprises a semiconductor device or circuit (not shown), at least one layer of interconnect (not shown), and a dielectric layer (not shown) covering the interconnect, all of which have been previously fabricated in semiconductor substrate 10 using conventional fabrication techniques. Subsequently fabricated passive components and flip chip bumps of the present invention will be electrically coupled to the semiconductor circuit and to the interconnect through vias (not shown) in the dielectric layer (not shown). However, in an alternative embodiment, semiconductor substrate or substrate 10 can also be an insulating substrate upon which flip chip bumps and passive components such as inductors are fabricated.

Seed layer 13 is sputtered onto substrate 10. While several seed layer compositions are known in the art, seed layer 13 of the present invention includes approximately 2 k Å of titanium tungsten 11 and up to 10 k Å of copper 12 which are sputtered in-situ to ensure proper electrical coupling between the conductive layers 11 and 12. The conditions for depositing sputtered titanium tungsten 11 and sputtered copper 12 are conventionally known in the art.

A region of seed layer 13 is then covered with material 14 to outline at least one inductor 17 and flip chip bump structure 16 on seed layer 13. While dielectrics such as nitride, oxide, and polyimide can be used, photoresist is preferably used for material 14 due to its ease of removal. Photoresist 14 is spun onto seed layer 13 and exposed and developed into photoresist pattern 15 using conventional processing techniques. Photoresist pattern 15 defines inductor 17 and flip chip bump structure 16 on seed layer 13. The width of each segment of inductor 17 is dependent upon the desired inductance value. Photoresist pattern 15 can also define ground planes, resistors, and other passive components on seed layer 13.

While photoresist pattern 15 covers a region of seed layer 13, conductive layer 18 is plated onto a different region of seed layer 13 which is not covered by photoresist pattern 15. The plating process conventionally used is electrolysis plating or electroplating. As a result of its superior conductive properties, copper is preferably used for conductive layer 18 and is approximately 5 to 10 microns thick. Copper 18 forms inductor 17 and flip chip bump structure 16. As depicted in FIG. 1, photoresist 14 is thicker than electroplated copper 18 to ensure that inductor 17 and flip chip bump structure 16 are not shorted together by electroplated copper 18.

Figure 2:
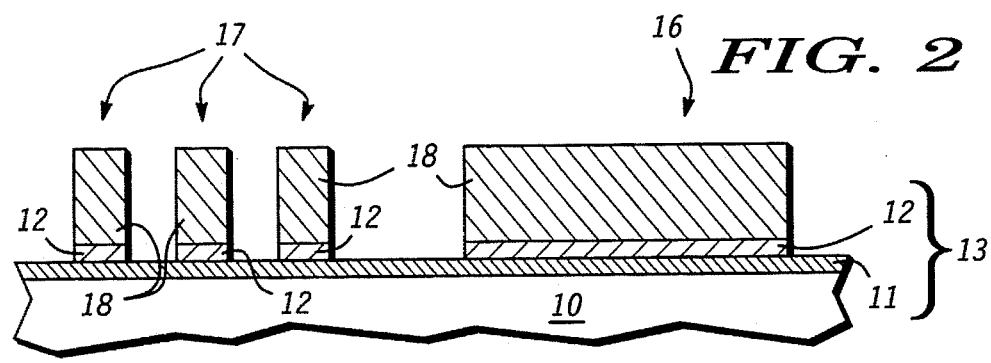

Continuing with FIG. 2, photoresist 14 is removed from seed layer 13 by a conventional stripping process, and the region of sputtered copper 12 not covered by electroplated copper 18 is etched away. The upper section of seed layer 13 or sputtered copper 12 which has not been plated by copper 18 is removed to eliminate electrical shorting of inductor 17 and flip chip bump structure 16 caused by seed layer 13. While sputtered titanium tungsten 11 can also be etched away at this step in an alternative embodiment, titanium tungsten 11 is not removed at this step for the preferred embodiment. Titanium tungsten 11 remains over substrate 10 to provide the appropriate electrical coupling and biasing required for a subsequent electroplating process. If titanium tungsten 11 were removed at this step, an additional seed layer would need to be deposited for the subsequent electroplating process. However, titanium tungsten 11 can be removed at this step if the subsequent electroplating process were substituted with a different, but likely slower, process.

Removal of upper layer 12 of seed layer 13, or sputtered copper 12, is preferably accomplished by selectively etching sputtered copper 12 over electroplated copper 18. Performed in this manner, the inductance value of electroplated copper inductor 17 will not be detrimentally altered compared to using commercially available etchants such as Metex FA/Metex FB which etch electroplated copper at a faster rate than sputtered copper. As discussed in U.S. Pat. No. 5,409,567, which is issued to Lytle, et. al., on Apr. 25, 1995 and which is hereby incorporated by reference, ammonium peroxydisulfate is used for selectively etching sputtered copper ever electroplated copper.

Figure 3:
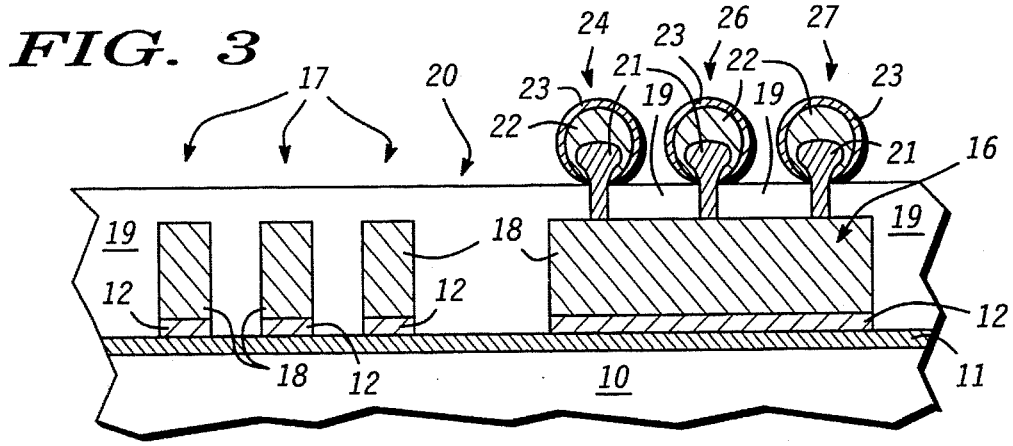

Turning to FIG. 3, material 19 is used to define flip chip bumps 24, 26, and 27 on portion 16 or flip chip bump structure 16. As known in the art, a plurality of flip chip bumps or a single flip chip bump can be fabricated on flip chip bump structure 16. Flip chip bumps 24, 26, and 27 are each up to approximately 200 microns in diameter. As mentioned previously, due to its ease of removal, material 19 is preferably photoresist which forms photoresist pattern 20. Inductor 17 and the exposed region of sputtered titanium tungsten 11 are masked by photoresist pattern 20.

Portion 21 of flip chip bumps 24, 26, and 27 is fabricated by electroplating conductive material 21 onto exposed portions of electroplated copper 18. Portion 21, preferably comprising copper, is plated to a thickness or height greater than photoresist pattern 20. The height of portion 21 is approximately 15 microns. After electroplating copper 21 onto electroplated copper 18, portion 22 of flip chip bumps 24, 26, and 27 is plated onto copper 21, and portion 23 of flip chip bumps 24, 26, and 27 is plated onto portion 22. As commonly used in the art, portions 22 and 23 are lead and tin, respectively. Alternatively, portions 22 and 23 can be any solderable material including antimony, silver, and the like. Lead 22 and tin 23 complete the formation of flip chip bumps 24, 26, and 27. The combined height of portions 22 and 23 is approximately 50 microns with a lead to tin ratio of 2:3 or 9:1.

Figure 4:
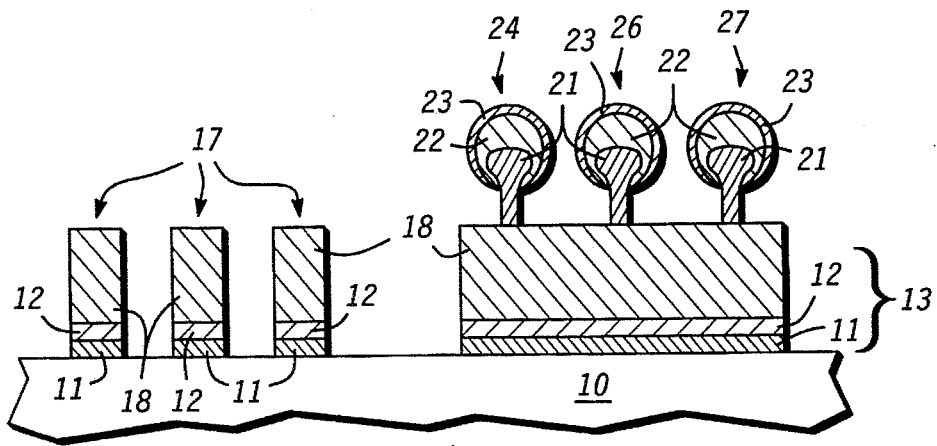

FIG. 4 completes the processing of flip chip semiconductor device 28. Photoresist 19 is removed using a conventional stripping process, and the exposed region of titanium tungsten 11 is removed by etching in hydrogen peroxide. If titanium tungsten 11 of seed layer 13 were completely removed in FIG. 2, as described in an alternative embodiment, material 19 can be a dielectric such as oxide, nitride, or polyimide since it does not have to be subsequently removed to etch away the remaining section of seed layer 13.

Flip chip bumps 24, 26, and 27 remain shorted together by flip chip bump structure 16. As mentioned previously, an alternative embodiment uses a single flip chip bump structure for each flip chip bump. Flip chip bumps 24, 26, and 27 can be subsequently reshaped during a reflow process. To complete flip chip semiconductor device or electronic device 28, a passivation layer (not shown) covers and protects inductor 17 but leaves flip chip bumps 24, 26, and 27 exposed for electrical contact to a leadframe, substrate, or die.

Therefore, in accordance with the present invention, it is apparent there has been provided an improved method of fabricating a flip chip semiconductor device having an integrated inductor which overcomes the disadvantages of the prior art. The present invention eliminates the degradation of inductors during the seed layer removal process and does not significantly increase the cycle time of the overall process. The present invention provides an improved method for simultaneously fabricating an inductor and a flip chip bump on a semiconductor die.

We claim:

1. A method of fabricating a semiconductor device having at least one inductor and at least one flip chip bump, the method comprising the steps of:

providing a semiconductor substrate having the semiconductor device;

sputtering titanium tungsten over the semiconductor substrate;

sputtering copper to provide sputtered copper over the titanium tungsten;

covering a first region of the sputtered copper with a first photoresist pattern defining the at least one inductor and the at least one flip chip bump;

electroplating copper to provide electroplated copper over the splattered copper not covered by the first photoresist pattern forming the at least one inductor and a first portion of the at least one flip chip bump;

stripping the first photoresist pattern off of the sputtered copper;

etching away the sputtered copper not covered by the electroplated copper;

covering the at least one inductor and the titanium tungsten with a second photoresist pattern to define a second portion of the at least one flip chip bump over the first portion of the at least one flip chip bump;

electroplating copper over the first portion of the at least one flip chip bump to form the second portion of the at least one flip chip bump;

plating lead over the second portion of the at least one flip chip bump to form a third portion of the at least one flip chip bump;

plating tin over the lead to form a fourth portion of the at least one flip chip bump;

stripping the second photoresist pattern off of the at least one inductor and the titanium tungsten; and etching away the titanium tungsten not covered by the electroplated copper.

2. The method according to claim 1 further comprising reflowing the at least one flip chip bump.

3. The method according to claim 1 further comprising using ammonium peroxydisulfate for etching the sputtered copper not covered by the electroplated copper.

4. The method according to claim 1 wherein the etching of the sputtered copper further includes selectively etching the sputtered copper over the electroplated copper.

5. The method according to claim 1 further comprising using hydrogen peroxide for etching the titanium tungsten not covered by the sputtered copper.

6. A method of making an electronic device, the method comprising:

providing a substrate;

forming a seed layer over the substrate;

outlining an inductor and a flip chip bump over the seed layer by masking a first region of the seed layer with a first material;

providing a first conductive layer over the seed layer not masked by the first material to form the inductor and a first portion of the flip chip bump;

outlining a second portion of the flip chip bump over the first portion of the flip chip bump by masking the inductor with a second material; and providing a second conductive layer over the first portion of the flip chip bump to form the second portion of the flip chip bump.

7. The method according to claim 6 further including providing a third conductive layer over the second conductive layer.

8. The method according to claim 7 further providing lead for the third conductive layer.

9. The method according to claim 7 further including providing a fourth conductive layer over the third conductive layer.

10. The method according to claim 9 further providing tin for the fourth conductive layer.

11. The method according to claim 6 further including reflowing the flip chip bump.

12. The method according to claim 6 further including removing the first material from the seed layer prior to outlining the second portion of the flip chip bump over the first portion of the flip chip bump.

13. The method according to claim 12 further including removing at least an upper layer of the seed layer not plated by the first conductive layer after removing the first material from the seed layer and prior to outlining the second portion of the flip chip bump over the first portion of the flip chip bump.

14. The method according to claim 6 further providing titanium tungsten and copper for the seed layer.

15. The method according to claim 6 further including selecting the first and second material from the group consisting of nitride, oxide, polyimide, and photoresist.

16. The method according to claim 6 further providing copper for the first and second conductive layers.

17. The method according to claim 6 wherein the electronic device further contains a semiconductor device electrically coupled to the inductor and the flip chip bump.

* * * * *